United States Patent [19]
Hara et al.

[11] Patent Number: 5,101,125
[45] Date of Patent: Mar. 31, 1992

[54] SEMICONDUCTOR INTEGRATED CIRCUIT WITH IMPROVED I/O STRUCTURE WITH ECL TO CMOS TO ECL CONVERSION

[75] Inventors: Hiroyuki Hara, Fujisawa; Yasuhiro Sugimoto, Yokohama, both of Japan

[73] Assignee: Kabushiki Kaisha Toshiba, Kanagawa, Japan

[21] Appl. No.: 511,747

[22] Filed: Apr. 20, 1990

[30] Foreign Application Priority Data

Apr. 26, 1989 [JP] Japan ................................. 1-106529

[51] Int. Cl.$^5$ ..................... H03K 19/092; H03K 3/01
[52] U.S. Cl. ................................. 307/475; 307/296.6
[58] Field of Search .................. 307/475, 296.6, 296.7, 307/296.8

[56] References Cited

U.S. PATENT DOCUMENTS

| | | | |
|---|---|---|---|
| 4,437,171 | 3/1984 | Hudson et al. | 307/475 |
| 4,785,205 | 11/1988 | Sanwo et al. | 307/475 |
| 4,794,317 | 12/1988 | van Tran | 307/475 |
| 4,806,799 | 2/1989 | Pelley, III et al. | 307/475 |
| 4,841,175 | 6/1989 | DeMan et al. | 307/475 |
| 4,891,535 | 1/1990 | Etheridge | 307/475 |
| 4,947,061 | 8/1990 | Metz et al. | 307/475 |
| 4,968,905 | 11/1990 | Sanwo et al. | 307/475 |

OTHER PUBLICATIONS

"Fabrication and Evaluation of The ECL/TTL Compatible Bi-CMOS Gate Array", T. IEE Japan, vol. 108-C, No. 12, 1988, Y. Sugimoto and H. Hara, et al.

*Primary Examiner*—Edward P. Westin
*Assistant Examiner*—Richard Roseen
*Attorney, Agent, or Firm*—Banner, Birch, McKie & Beckett

[57] ABSTRACT

A semiconductor integrated circuit includes a bias voltage generating circuit and first- and second-level signal generating circuits. The bias voltage generating circuit includes a bandgap reference circuit for generating a first fixed voltage as a first bias voltage and a second fixed voltage. A second bias voltage is generated on the basis of the second fixed voltage. The second-level signal generating circuit receives a predetermined first-level signal and generates a predetermined second-level signal on the basis of the first and second bias voltages generated by the bias voltage generating circuit. The first-level signal generating circuit receives the predetermined second-level signal and generates the predetermined first-level signal on the basis of the first and second bias voltages generated by the bias voltage generating circuit.

26 Claims, 3 Drawing Sheets

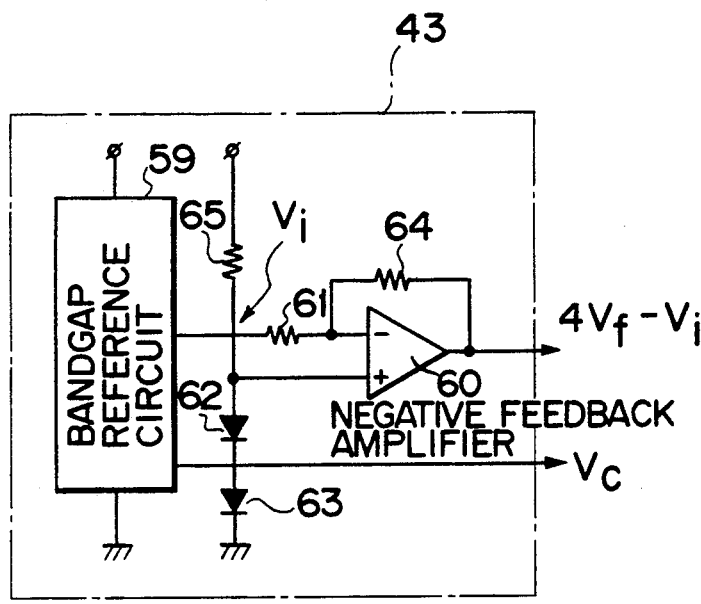
F I G. 4
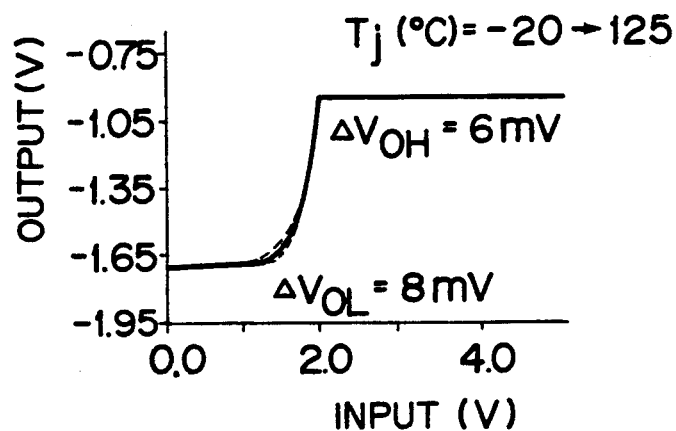
F I G. 5

SEMICONDUCTOR INTEGRATED CIRCUIT WITH IMPROVED I/O STRUCTURE WITH ECL TO CMOS TO ECL CONVERSION

BACKGROUND OF THE INVENTION

1. Field of the Invention

The present invention relates to a semiconductor integrated circuit and, more particularly, to a semiconductor integrated circuit including an input/output circuit for receiving and processing signals having different levels.

2. Description of the Related Art

FIG. 1 shows a conventional input circuit for use in an LSI operated at a CMOS level (0 to 5 V), and designed to receive an external ECL level ($-0.8$ to $-1.7$ V) signal.

More specifically, when the ECL level of an input terminal 1 is high, a differential bipolar transistor 2 is turned on, and a current is not supplied to a resistor 3. Therefore, the potential of the emitter of a bipolar transistor 4 goes to high level, and a high signal set at the CMOS level appears at an output terminal 5.

On the other hand, when the ECL level of the input terminal 1 is low, a differential bipolar transistor 6 is turned on, and a current is supplied to the resistor 3. Therefore, the emitter potential of the bipolar transistor 4 goes to low level, and a low signal set at the CMOS level appears at the output terminal 5. Note that a voltage of 5 V is applied to a terminal 7, and a voltage of $-5.2$ V is applied to a terminal 8.

FIG. 2 shows a conventional output circuit for outputting an ECL level signal from an LSI operated at the CMOS level.

More specifically, the CMOS level signal at a terminal 11 is lowered through the base—emitter paths (0.7 V × 3) of bipolar transistors 12, 13, and 14, and an ECL level signal can be obtained at an output terminal 15. Note that a voltage of 5 V is applied to a terminal 16. The output circuit shown in FIG. 2 is disclosed in "Fabrication and Evaluation of the ECL/TTL Compatible BI-CMOS Gate Array", T. IEE Japan, Vol. 108-C, No. 12, 1988, Y. Sugimoto, H. Hara et al.

In the above-mentioned input circuit shown in FIG. 1, an ECL negative power source ($-5.2$ V) must be arranged inside the LSI operated at the CMOS level. In addition, a maximum voltage of about 10 V is applied to the collector—emitter path of the differential bipolar transistor 6. The withstand voltage of the circuit may be a bar to the development of a high-speed and micropatterned device.

In addition, in the output circuit shown in FIG. 2, temperature compensation is not performed. Therefore, the ECL level signal output from the output terminal is changed in accordance with changes in temperature. This poses a problem when an interface with a temperature-compensated circuit such as an ECL 100K series is used.

SUMMARY OF THE INVENTION

It is an object of the present invention to provide a semiconductor integrated circuit for inputting/outputting an external ECL level signal to/from a semiconductor integrated circuit operated at a CMOS level without an internal ECL negative power source.

It is another object of the present invention to provide a semiconductor integrated circuit including an input/output circuit in which any change in input/output level due to temperature change is compensated for.

In order to achieve the above objects, according to the present invention, there is provided a semiconductor integrated circuit comprising:

bias voltage generating means having a bandgap reference circuit for generating a first fixed voltage as a first bias voltage and a second fixed voltage, and a second bias voltage being generated based on the second fixed voltage;

second-level signal generating means for receiving a predetermined first-level signal and generating a corresponding second-level signal on the basis of the first and second bias voltages generated by the bias voltage generating means; and first-level signal generating means for receiving a predetermined second-level signal and generating a corresponding first-level signal on the basis of the first and second bias voltages generated by the bias voltage generating means.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 is a circuit diagram showing in detail the arrangement of the bias circuit shown in FIG. 3; and FIG. 5 is a graph showing temperature dependency of the output level of an output circuit according to the present invention.

DETAILED DESCRIPTION OF THE PREFERRED EMBODIMENT

An embodiment of the present invention will now be described in detail, with reference to the drawings.

Figure 1:
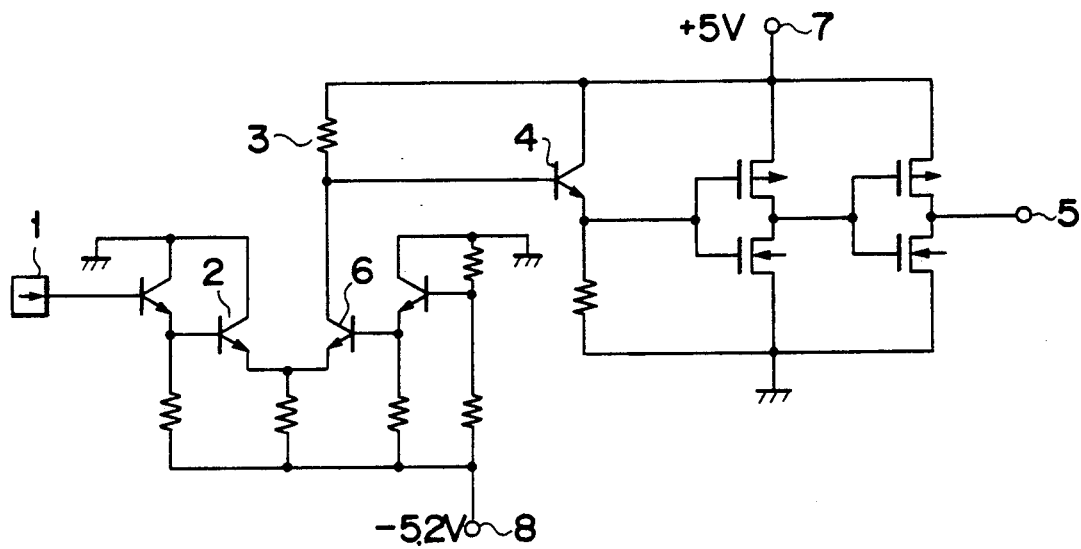
FIG. 1 is a circuit diagram showing an input circuit of a conventional CMOS level operating chip.
Figure 2:
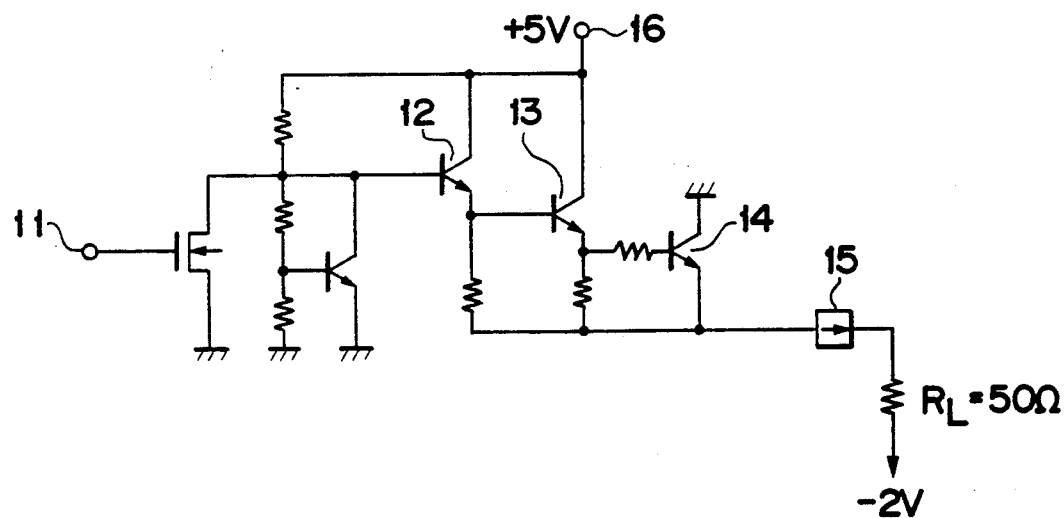
FIG. 2 is a circuit diagram showing an output circuit of a conventional CMOS level operating chip.
Figure 3:
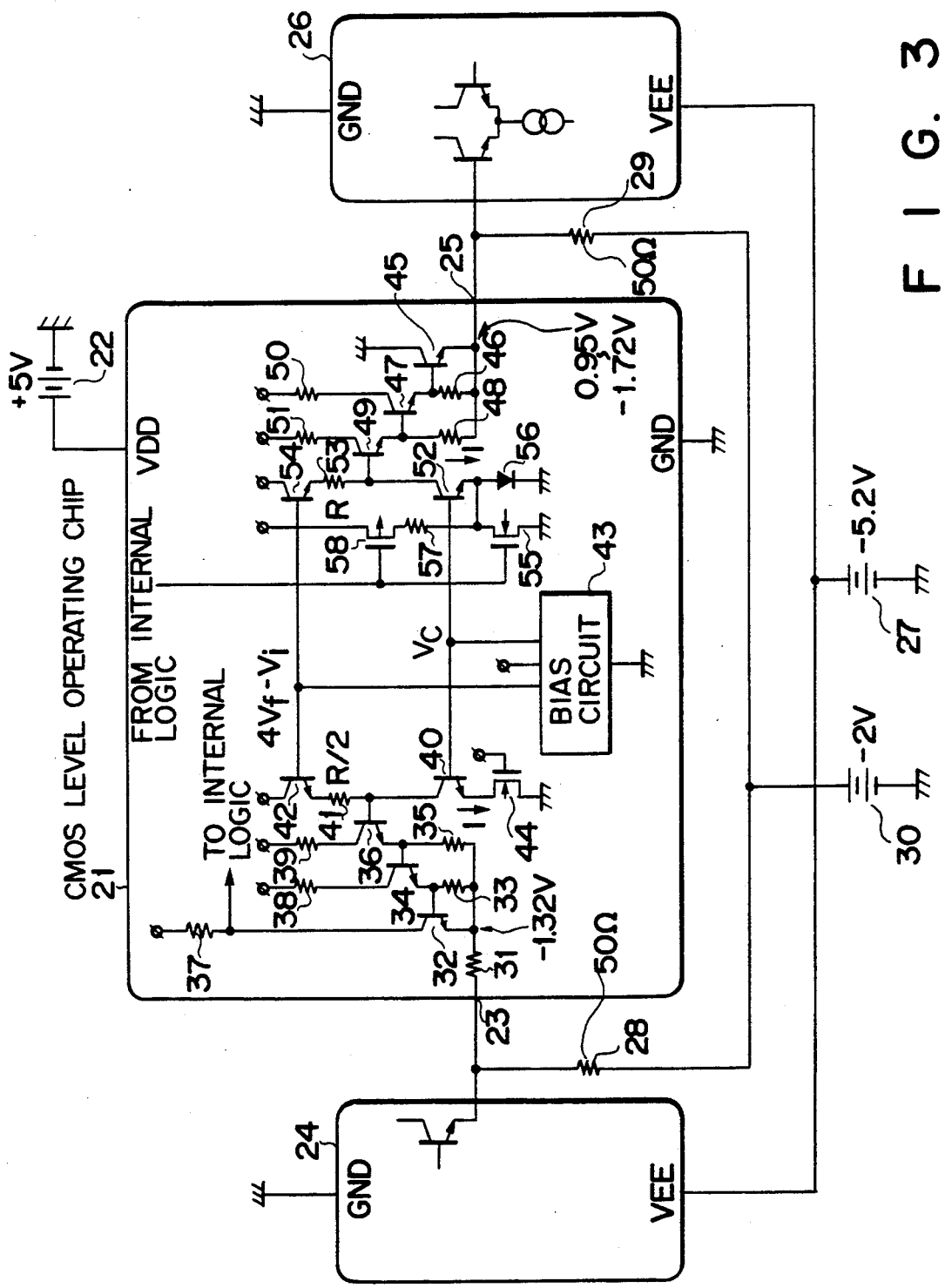
FIG. 3 is a circuit diagram showing an embodiment of the present invention.

FIG. 3 shows an embodiment of the present invention. A $+5$ V power source 22 of a CMOS level operating chip 21 is externally connected to a power source terminal VDD, and a terminal GND is grounded. An ECL level operating chip 24 is connected to an ECL level input terminal 23 of the chip 21, and an ECL level operating chip 26 is connected to an ECL level output terminal 25 thereof. In each of the ECL level operating chips 24 and 26, a power source terminal VEE is connected to a power source 27 of $-5.2$ V, and a terminal GND is grounded. The ECL level input terminal 23 and the ECL level output terminal 25 of the CMOS level operating chip 21 are connected to a power source 30 of $-2$ V through 50 Ω resistors 28 and 29, respectively.

Input and output circuits of the CMOS level operating chip 21 will now be described. The ECL level input terminal 23 is connected to the emitter of a bipolar transistor 32 through a resistor 31, the emitter of the transistor 32 is connected to the emitter of a bipolar transistor 34 through a resistor 33, and is also connected to the emitter of a bipolar transistor 36 through a resistor 35. The collector of the transistor 32 is connected to the input terminal of a CMOS level internal logic, and is also connected to the terminal VDD through a resistor 37. The collector of the transistor 34 is connected to the terminal VDD through a resistor 38, and the collector of the transistor 36 is connected to the terminal VDD through a resistor 39. The base of the transistor 36 is connected to the collector of a bipolar transistor 40, and is also connected to the emitter of a bipolar transistor 42 through a resistor 41 having a resistance of R/2. The collector of the transistor 42 is connected to the terminal VDD, and the base thereof is connected to the second output terminal of a bias circuit 43. The emitter of the transistor 40 is grounded through a MOS transistor 44, and the base thereof is connected to the first output terminal of the bias circuit 43. Also connected to the terminal VDD are the gate of the transistor 44 and the bias circuit 43.

The ECL level output terminal 25 is connected to the emitter of a bipolar transistor 45, which itself is connected to the emitter of a bipolar transistor 47 through a resistor 46, and also to the emitter of a bipolar transistor 49, through a resistor 48. The collector of the transistor 45 is grounded, and that of the transistor 47 is connected to the terminal VDD through a resistor 50. In addition, the collector of the transistor 49 is connected to the terminal VDD through a resistor 51, and its base is connected to the collector of a bipolar transistor 52, and also to the emitter of a bipolar transistor 54, through a resistor 53 having a resistance of R. The collector of the transistor 54 is connected to the terminal VDD, and the base thereof is connected to the second output terminal of the bias circuit 43. The emitter of the transistor 52 is grounded through a MOS transistor 55, and also through a diode 56, and is connected to the terminal VDD through a resistor 57 and a MOS transistor 58. The base of the transistor 52 is connected to the first output terminal of the bias circuit 43, and the gates of the transistors 55 and 58 are connected to the output terminal of the CMOS level internal logic.

The bias circuit 43 shown in FIG. 4 includes a bandgap reference circuit 59, this circuit generating permanent potentials $V_i$ and $V_c$ which are free from temperature dependency. The potential $V_i$ is applied to the inverting input terminal of a negative feedback amplifier 60 through a resistor 61, and a potential of $2V_F$ ($V_F \times 2$) of diodes 62 and 63 is applied to the noninverting input terminal. As a result, a potential of $4V_F - V_i$ is obtained at the second output terminal of the negative feedback amplifier 60, and a potential of $V_c$ at the first output terminal thereof. A resistor 64 is connected between the output terminal and the noninverting input terminal of the negative feedback amplifier 60 and is set to have a resistance equal to that of the resistor 61. The non-inverting input terminal of the amplifier 60 is connected, through a resistor 65, to the terminal VDD.

Referring to the input circuit shown in FIG. 3, the ECL level signal from the ECL level operating chip 24 is supplied to the emitter of the bipolar transistor 32 through the resistor 31, the emitter of the transistor 32 being fixed at a potential of $-V_i-(R/2)\cdot I$, lower than the second output of $4V_F-V_i$ from the bias circuit 43 by $4V_F$ of the bipolar transistors 32, 34, 36, and 42, and $(R/2)\cdot I$, which corresponds to a voltage drop across the resistor 41. When this potential is set at $-1.32$ V, which is an intermediate value between voltages $-0.95$ V and $-1.72$ V of the ECL level signal, the bipolar transistor 32 is turned on when the ECL level signal is low, and off when this signal is high. When a current supplied to the resistor 37 is turned on/off, a CMOS level signal can be supplied to the internal logic.

Referring now to the output circuit shown in FIG. 3, the bipolar transistor 52 is turned on/off in response to the CMOS level signal from the internal logic, and a constant current I supplied to the resistor 53 is turned on/off. As a result, a potential of $-V_i$, lower than the second output of $4V_F-V_i$ from the bias circuit 43 by $4V_F$ of the bipolar transistors 45, 47, 49, and 54, is output as a high level potential. In addition, a potential of $-V_i-R\cdot I$, lower than the potential of $-V_i$ by $R\cdot I$, which corresponds to a voltage drop across the resistor 53, is output as a low level potential. When the fixed potentials $V_i$ and $V_c$ of the bandgap reference circuit 59 shown in FIG. 4 are set such that the potential $V_i$ is the absolute value of the high level of the ECL level signal, i.e., $+0.95$ V, and the potential $V_c$ is at a level which allows supply of the constant current I for producing the amplitude of the ECL level signal, the ECL level signal of $-0.95$ V to $-1.72$ V can be output from the output terminal 25.

As described above, in the LSI operated at the CMOS level, the ECL level signal can be input/output without the need to arrange an ECL negative power source inside the CMOS level operating chip 21. FIG. 5 shows simulated temperature dependencies of an output level of the output circuit. As is apparent from FIG. 5, the temperature dependency $\Delta V_{OH}$ in a high output state ($-0.95$ V) at $-20°$ to $125°$ C. is 6 mV, and the temperature dependency $\Delta V_{OL}$ in a low output state ($-1.72$ V) is 8 mV. These dependencies are very small, and the output ECL level is temperature-compensated. The temperature dependency of the threshold potential of the input circuit is also as small as 60 mV, and an interface with a temperature-compensated ECL 100 K series can be performed.

In addition, the bias circuit in the above embodiment is commonly used to provide a bias to a plurality of input/output circuits. Therefore, the scale of the circuit is not much larger than that of the conventional circuit.

As has been described above, according to the present invention, there is provided a semiconductor integrated circuit including input/output circuits which can input/output an external ECL level signal to/from a semiconductor integrated circuit operated at a CMOS level without an internal ECL negative power source, and in which an input/output level is temperature-compensated.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit comprising:
   bias voltage generating means for generating a first bias voltage and a second bias voltage;
   second-level signal generating means, coupled to the first and second bias voltages, for receiving a predetermined first voltage level signal and generating a corresponding second voltage level signal using the first and second bias voltages to generate the corresponding second voltage level signal; and
   first-level signal generating means, coupled to the first and second bias voltages, for receiving a predetermined second voltage level signal and generating a corresponding first voltage level signal using the first and second bias voltages to generate the corresponding first voltage level signal.

2. A circuit according to claim 1, wherein said bias voltage generating means includes a bandgap reference circuit for generating a first fixed voltage and a second fixed voltage, the first fixed voltage being the first bias voltage, and a negative feedback amplifier for generating the second bias voltage from the second fixed voltage.

3. A circuit according to claim 2, wherein said negative feedback amplifier includes an inverting input terminal coupled to the second fixed voltage output from said bandgap reference circuit, and a non-inverting terminal coupled to a potential being twice a base-emitter voltage of a bipolar transistor.

4. A circuit according to claim 3, wherein said negative feedback amplifier includes feedback means coupled to said negative feedback amplifier for producing an output voltage from the negative feedback amplifier equal to $4V_F - V_i$ when the second fixed voltage is $V_i$, and the potential is $2V_F$, where $V_F$ equals the potential of a base-emitter voltage of a bipolar transistor.

5. A circuit according to claim 1, wherein said second-level signal generating means includes a first bipolar transistor having a base coupled to the second bias voltage, a collector coupled to a first power source terminal, and an emitter coupled to a constant current source through a first resistor; a second bipolar transistor having an emitter, and a base coupled to said emitter of said first bipolar transistor through said first resistor; a third bipolar transistor having an emitter, and a base connected to said emitter of said second bipolar transistor; and a fourth bipolar transistor having a base coupled to said emitter of said third bipolar transistor, an emitter coupled to said emitters of said second and third bipolar transistors through second and third resistors, respectively, and also coupled to an input terminal through a fourth resistor, the input terminal for inputting the predetermined first-level signal, and a collector serving as an output terminal for outputting the corresponding second-level signal and coupled to said first power source terminal through a fifth resistor.

6. A circuit according to claim 1, wherein said first-level signal generating means includes a fifth bipolar transistor having a base coupled to the second bias voltage, a collector coupled to a first power source terminal, and an emitter coupled to a constant current source, the fifth bipolar transistor being switched in response to the predetermined second-level signal; a sixth bipolar transistor having an emitter, and a base coupled to said emitter of said fifth bipolar transistor through a sixth resistor; a seventh bipolar transistor having an emitter, and a base coupled to said emitter of said sixth bipolar transistor; and an eighth bipolar transistor having a base coupled to said emitter of said seventh bipolar transistor, and an emitter serving as an output terminal for outputting the corresponding first-level signal and coupled to said emitters of said sixth and seventh bipolar transistors through seventh and eight resistors, respectively.

7. A semiconductor integrated circuit comprising an input circuit and an output circuit, said input circuit including:
first bias voltage output means for outputting as a first bias voltage;
second bias voltage output means for outputting a second bias voltage; and
CMOS level signal generating means, coupled to the first and second bias voltages, for receiving an ECL level signal and generating a corresponding CMOS level signal based on the first and second bias voltages.

8. A circuit according to claim 7, wherein said second bias voltage output means includes a negative feedback amplifier coupled to a bandgap reference circuit for generating the second bias voltage.

9. A circuit according to claim 8, wherein said negative feedback amplifier includes an inverting input terminal coupled to said bandgap reference circuit, and a non-inverting input terminal coupled to a potential being twice a base-emitter voltage of a bipolar transistor.

10. A circuit according to claim 9, wherein said negative feedback amplifier includes feedback means coupled to said negative feedback amplifier for producing an output voltage from the negative feedback amplifier equal to $4V_F - V_i$ when the second fixed voltage is $V_i$, and the potential is $2V_F$, where $V_F$ equals the potential of a base-emitter voltage of a bipolar transistor.

11. A circuit according to claim 7, wherein said CMOS level signal generating means includes a first bipolar transistor having a base coupled to the second fixed bias voltage, a collector coupled to a first power source terminal, and an emitter coupled to a constant current source through a first resistor; a second bipolar transistor having an emitter, and a base coupled to said emitter of said first bipolar transistor through said first resistor; a third bipolar transistor having an emitter, and a base coupled to said emitter of said second bipolar transistor; and a fourth bipolar transistor having a base coupled to said emitter of said third bipolar transistor, an emitter coupled to said emitters of said second and third bipolar transistors through second and third resistors, respectively, and also coupled to an input terminal through a fourth resistor, the input terminal for inputting the ECL level signal, and a collector serving as an output terminal for outputting the corresponding CMOS level signal and coupled to said first power source terminal through fifth resistor.

12. A semiconductor integrated circuit comprising an input circuit and an output circuit, said output circuit including:
first bias voltage output means for outputting a first positive bias voltage;
second bias voltage output means for outputting a second positive bias voltage; and
ECL level signal generating means, coupled to the first and second bias voltages, for receiving a CMOS level signal and generating a corresponding ECL level signal based on the first and second bias voltages.

13. A circuit according to claim 12, wherein said second bias voltage output means includes a negative feedback amplifier coupled to a bandgap reference circuit for generating the second positive bias voltage.

14. A circuit according to claim 13, wherein said negative feedback amplifier includes an inverting input terminal coupled to the second fixed voltage output from said bandgap reference circuit, and a non-inverting terminal coupled to a potential being twice a base-emitter voltage of a bipolar transistor.

15. A circuit according to claim 14, wherein said negative feedback amplifier includes feedback means coupled to said negative feedback amplifier for producing an output voltage from the negative feedback amplifier equal to $4V_F - V_i$ when the second fixed voltage is $V_i$, and the potential is $2V_F$, where $V_F$ equals the potential of a base-emitter voltage of a bipolar transistor.

16. A circuit according to claim 12, wherein said ECL level signal generating means includes a first bipolar transistor having a base coupled to the second fixed bias voltage, a collector coupled to a first power source terminal, and an emitter coupled to a constant current source, and switched in response to the CMOS level signal; a second bipolar transistor having an emitter, and a base coupled to said emitter of said first bipolar transistor through a first resistor; a third bipolar transistor having an emitter, and a base coupled to said emitter of said second bipolar transistor; and a fourth bipolar transistor having a base coupled to said emitter of said third bipolar transistor, and an emitter serving as an output terminal for outputting the corresponding ECL level signal coupled to said emitters of said second and third bipolar transistors through second and third resistors, respectively.

17. A semiconductor integrated circuit comprising an input circuit and an output circuit, said input circuit including:
   first bias voltage output means for outputting as a first bias voltage a first fixed voltage generated by a bandgap reference circuit;
   second bias voltage output means for outputting a second bias voltage generated from a second fixed voltage generated by said bandgap reference circuit, said second biased voltage output means including a negative feedback amplifier coupled to the bandgap reference circuit for generating the second bias voltage, said negative feedback amplifier including an inverting input terminal coupled to receive the second fixed voltage, and a non-inverting input terminal coupled to a potential being twice a base-emitter voltage of a bipolar transistor; and
   CMOS level signal generating means for receiving an ECL signal and generating a corresponding CMOS level signal related to the first and second bias voltages.

18. A circuit according to claim 17, wherein said negative feedback amplifier includes feedback means coupled to said negative feedback amplifier for producing an output voltage from the negative feedback amplifier equal to $4V_F - V_i$ when the second fixed voltage is $V_i$, and the potential is $2V_F$, where $V_F$ equals the potential of a base-emitter voltage of a bipolar transistor.

19. A semiconductor integrated circuit comprising an input circuit and an output circuit, said output circuit including:
   first bias voltage output means for outputting as a first bias voltage a first fixed voltage generated by a bandgap reference circuit;
   second bias voltage output means for outputting a second bias voltage generated from a second fixed voltage generated by said bandgap reference circuit, said second bias voltage output means including a bandgap reference circuit and a negative feedback amplifier for generating the second bias voltage from the second fixed voltage, said negative feedback amplifier includes an inverting input terminal coupled to the second fixed voltage and a non-inverting terminal coupled to receive a potential being twice a base-emitter voltage of a bipolar transistor; and
   ECL level signal generating means for receiving a CMOS level signal and generating a corresponding ECL level signal related to the first and second bias voltages.

20. A circuit according to claim 19, wherein said negative feedback amplifier includes feedback means coupled to said negative feedback amplifier for producing an output voltage from the negative feedback amplifier equal to $4V_F - V_i$ when the second fixed voltage is $V_i$, and the potential is $2V_F$, where $V_F$ equals the potential of a base-emitter voltage of a bipolar transistor.

21. A semiconductor integrated circuit comprising:
   first bias voltage output means for outputting a first bias voltage;
   second bias voltage output means for outputting a second bias voltage;
   CMOS level signal generating means, coupled to the first and second bias voltage output means, for receiving an ECL level signal and generating a corresponding CMOS level signal based on the first and second bias voltages; and
   ECL level signal generating means, coupled to the first and second bias voltage output means, for receiving a CMOS level signal and generating a corresponding ECL level signal based on the first and second bias voltages.

22. A circuit according to claim 21, wherein said bias voltage generating means includes a bandgap reference circuit for generating a first fixed voltage and a second fixed voltage, the first fixed voltage being the first bias voltage, and a negative feedback amplifier for generating the second bias voltage from the second fixed voltage.

23. A circuit according to claim 22, wherein said negative feedback amplifier includes an inverting input terminal coupled to the second fixed voltage output from said bandgap reference circuit, and a non-inverting terminal coupled to a potential being twice a base-emitter voltage of a bipolar transistor.

24. A circuit according to claim 23, wherein said negative feedback amplifier includes a feedback means coupled to said negative feedback amplifier for producing an output voltage from the negative feedback amplifier equal to $4V_F - V_i$ when the second fixed voltage is $V_i$, and the potential is $2V_F$.

25. A circuit according to claim 21, wherein said CMOS level signal generating means includes a first bipolar transistor having a base coupled to the second bias voltage output means, a collector coupled to a first power source terminal, and an emitter coupled to a constant current source through a first resistor; a second bipolar transistor having an emitter, and a base coupled to said emitter of said first bipolar transistor through said first resistor; a third bipolar transistor having an emitter, and a base connected to said emitter of said bipolar transistor; and fourth bipolar transistor having a base coupled to said emitter of said third bipolar transistor, an emitter coupled to said emitters of said second and third bipolar transistors through second and third resistors, respectively, and also coupled to an input terminal through a fourth resistor, the input terminal for inputting said ECL level signal, and a collector serving as an output terminal for outputting the corresponding CMOS level signal and coupled to said first power source terminal through a fifth resistor.

26. A circuit according to claim 21, wherein said ECL level signal generating means includes a fifth bipolar transistor having a base coupled to the second bias voltage output means, a collector coupled to a first power source terminal, and an emitter coupled to a constant current source, the fifth bipolar transistor being switched in response to said CMOS level signal; a sixth bipolar transistor having an emitter, and a base coupled to said emitter of said fifth bipolar transistor through a sixth resistor; a seventh bipolar transistor having an emitter, and a base coupled to said emitter of said sixth bipolar transistor; and an eighth bipolar transistor having a base coupled to said emitter of said seventh bipolar transistor, and an emitter serving as an output terminal for outputting the corresponding ECL level signal and coupled to said emitters of said sixth and seventh bipolar transistors through seventh and eight resistors, respectively.

* * * * *